United States Patent
Ma et al.

(10) Patent No.: US 11,829,863 B2
(45) Date of Patent: Nov. 28, 2023

(54) NEURAL NETWORK CIRCUIT DEVICE

(71) Applicant: TOHOKU UNIVERSITY, Miyagi (JP)

(72) Inventors: Yitao Ma, Miyagi (JP); Tetsuo Endoh, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 729 days.

(21) Appl. No.: 17/043,203

(22) PCT Filed: Mar. 29, 2019

(86) PCT No.: PCT/JP2019/014353
§ 371 (c)(1),
(2) Date: Nov. 5, 2020

(87) PCT Pub. No.: WO2019/189895
PCT Pub. Date: Oct. 3, 2019

(65) Prior Publication Data
US 2022/0198247 A1    Jun. 23, 2022

(30) Foreign Application Priority Data
Mar. 30, 2018    (JP) .................. 2018-070165

(51) Int. Cl.
*G06N 3/063* (2023.01)
*G06N 3/049* (2023.01)
*G11C 11/54* (2006.01)

(52) U.S. Cl.
CPC ............ *G06N 3/063* (2013.01); *G06N 3/049* (2013.01); *G11C 11/54* (2013.01)

(58) Field of Classification Search
CPC ......... G06N 3/063; G06N 3/049; G11C 11/54
See application file for complete search history.

(56) References Cited

U.S. PATENT DOCUMENTS

| | | | | |
|---|---|---|---|---|
| 5,004,932 A | * | 4/1991 | Nejime | G06N 3/065 708/801 |
| 5,336,937 A | * | 8/1994 | Sridhar | G06N 3/065 326/112 |

(Continued)

FOREIGN PATENT DOCUMENTS

| | | |
|---|---|---|
| JP | H07161942 A | 6/1995 |
| JP | 2010146514 A | 7/2010 |
| WO | 2015041305 A1 | 3/2015 |

OTHER PUBLICATIONS

International Search Report issue in PCT/JP2019/041353 dated May 14, 2019.

(Continued)

*Primary Examiner* — David E Choi
(74) *Attorney, Agent, or Firm* — Fox Rothschild LLP; Carol Thorstad-Forsyth

(57) ABSTRACT

There is provided a neural network circuit device including a plurality of synapse circuits storing a synaptic coupling weight and a neuron circuit connected to the plurality of synapse circuits. The plurality of synapse circuits store the synaptic coupling weight in a non-volatile manner and output a voltage signal having a magnitude based on the stored synaptic coupling weight in response to an input signal. The neuron circuit includes a neuron MOS transistor having a floating gate and a plurality of control gates which are capacitively coupled to the floating gate and to which the voltage signals from the plurality of synapse circuits are input respectively, and a pulse generator outputting a pulse signal by turning on or off the neuron MOS transistor.

11 Claims, 12 Drawing Sheets

(56) References Cited

U.S. PATENT DOCUMENTS

| 5,706,403 A * | 1/1998 | Shibata | G06N 3/065 |
| | | | 706/33 |
| 2014/0358834 A1* | 12/2014 | Kim | G06N 3/088 |
| | | | 706/25 |
| 2014/0365416 A1* | 12/2014 | Kim | G11C 11/412 |
| | | | 706/26 |

OTHER PUBLICATIONS

G. W. Burr et al., "Large-scale neural networks implemented with non-volatile memory as the synaptic weight element: Comparative performance analysis (accuracy, speed, and power)," 2015 IEEE International Electron Devices Meeting (IEDM), Washington, DC, 2015.

S. P. Adhikari, H. Kim, R. K. Budhathoki, C. Yang and L. O. Chua, "A Circuit-Based Learning Architecture for Multilayer Neural Networks With Memristor Bridge Synapses," in IEEE Transactions on Circuits and Systems I: Regular Papers, vol. 62, No. 1, pp. 215-223, Jan. 2015.

M. Chu et al., "Neuromorphic Hardware System for Visual Pattern Recognition With Memristor Array and CMOS Neuron," in IEEE Transactions on Industrial Electronics, vol. 62, No. 4, pp. 2410-2419, Apr. 2015.

* cited by examiner

NEURAL NETWORK CIRCUIT DEVICE

CROSS REFERENCE TO RELATED APPLICATIONS

This application is a U.S. National Stage entry under 35 U.S.C. § 371 of International Application No. PCT/JP2019/014353, filed on Mar. 29, 2019, and which claims priority to Japanese Patent Application No. 2018-070165, filed on Mar. 30, 2018, both of which are hereby incorporated herein by reference in their entireties.

TECHNICAL FIELD

The present invention relates to a neural network circuit device.

BACKGROUND ART

There is known a neural network that performs information processing on a computer by using a brain system of a living body as a model. In addition, in order to realize a neural network by using a semiconductor element or the like, research on the constituent elements and circuits has been advanced. Various models of neural network circuit devices have been proposed. For example, in one model, coupling between neurons is allowed to have a synaptic coupling weight representing the strength of the coupling, and when an integrated value of a voltage of a pulse input from another neuron to one neuron and the coupling weight reaches a predetermined threshold value, the neuron fires, and the pulse is transmitted to the next neuron. In the case of such a model, it is necessary to store the synaptic coupling weight in the memory element.

As a non-volatile memory element, there is known, for example, a resistive random access memory (ReRAM), a phase change memory (phase change random access memory), or the like having a resistive memory element of which electric resistance is changed by an electric field induced giant resistance change. There is known a neural network circuit device that stores a synaptic coupling weight in such a non-volatile memory element (refer to, for example, Non-Patent Literatures 1 to 3).

CITATION LIST

Non-Patent Literature

Non-Patent Literature 1: G. W. Burr, P. Narayanan, R. M. Shelby, S. Sidler, I. Boybat, C. di Nolfo, and Y. Leblebici, IEDM, pp. 4.4.1-4.4.4, 2015.
Non-Patent Literature 2: M. Chu; B. Kim; S. Park; H. Hwang; M. Jeon; B.-H. Lee; B.-G. Lee, IEEE Trans. IE, Vol. 62, Issue 4, pp. 2410-2419, 2015.
Non-Patent Literature 3: S. P. Adhikari; H. Kim; R. K. Budhathoki; C. Yang; L. O. Chua, IEEE Trans. CAS, Vol. 62, Issue 1, pp. 215-223, 2015.

SUMMARY OF INVENTION

Technical Problem

In the neural network circuit devices described in Non-Patent Literatures 1 to 3, since the synaptic coupling weight is stored in a non-volatile storage element, electric power for retaining the memory of the synaptic coupling weight is not required, but sufficient optimization is not realized. Therefore, a neural network circuit device having a more optimal structure is desired.

In view of the above circumstances, an object of the invention is to provide a more optimized neural network circuit device.

Solution to Problem

In order to achieve the above object, according to the invention, there is provided a neural network circuit device including a plurality of synapse circuits storing a synaptic coupling weight and a neuron circuit connected to the plurality of synapse circuits. The plurality of synapse circuits store the synaptic coupling weight in a non-volatile manner and output a voltage signal having a magnitude based on the stored synaptic coupling weight in response to an input signal. The neuron circuit includes a neuron MOS transistor having a floating gate and a plurality of control gates which are capacitively coupled to the floating gate and to which the voltage signals from the plurality of synapse circuits are input respectively, and a pulse generator outputting a pulse signal by turning on or off the neuron MOS transistor.

According to the invention, there is also provided a neural network circuit device including a plurality of synapse circuits storing a synaptic coupling weight and a neuron circuit connected to the plurality of synapse circuits. The neuron circuit includes: a capacitor having one electrode grounded; a load connected between the other electrode of the capacitor and a power source, and a pulse generator generating a pulse signal on the basis of a potential of the other electrode. The plurality of synapse circuits include a pair of inverters being cross-coupled and each including an inverter MOS transistor and a magnetic tunnel junction element, which are connected in series, a writing unit allowing the magnetic tunnel junction elements to have different magnetization states by allowing a write current based on the synaptic coupling weight to be stored to flow in each magnetic tunnel junction element of the pair of inverters, and a reading unit activating the pair of inverters in response to an input signal and flowing a current discharging the other electrode of the capacitor via the inverter MOS transistor of one inverter.

Advantageous Effects of Invention

According to the invention, since the coupling weight stored in the synapse circuit is transmitted to the neuron circuit as a magnitude of the voltage, the neural network circuit device is configured to be more optimized so as to reduce the power consumption.

According to the invention, since the time required to change the magnetization state of the magnetic tunnel junction element is short, and since the time until shifting to the state where the operation of a pair of cross-coupled inverters operated in the case of outputting a signal weighted with the coupling weight is stable is short, the neural network circuit device can be configured to be more optimized so as to operate at a high speed.

DESCRIPTION OF EMBODIMENTS

First Embodiment

Figure 1:
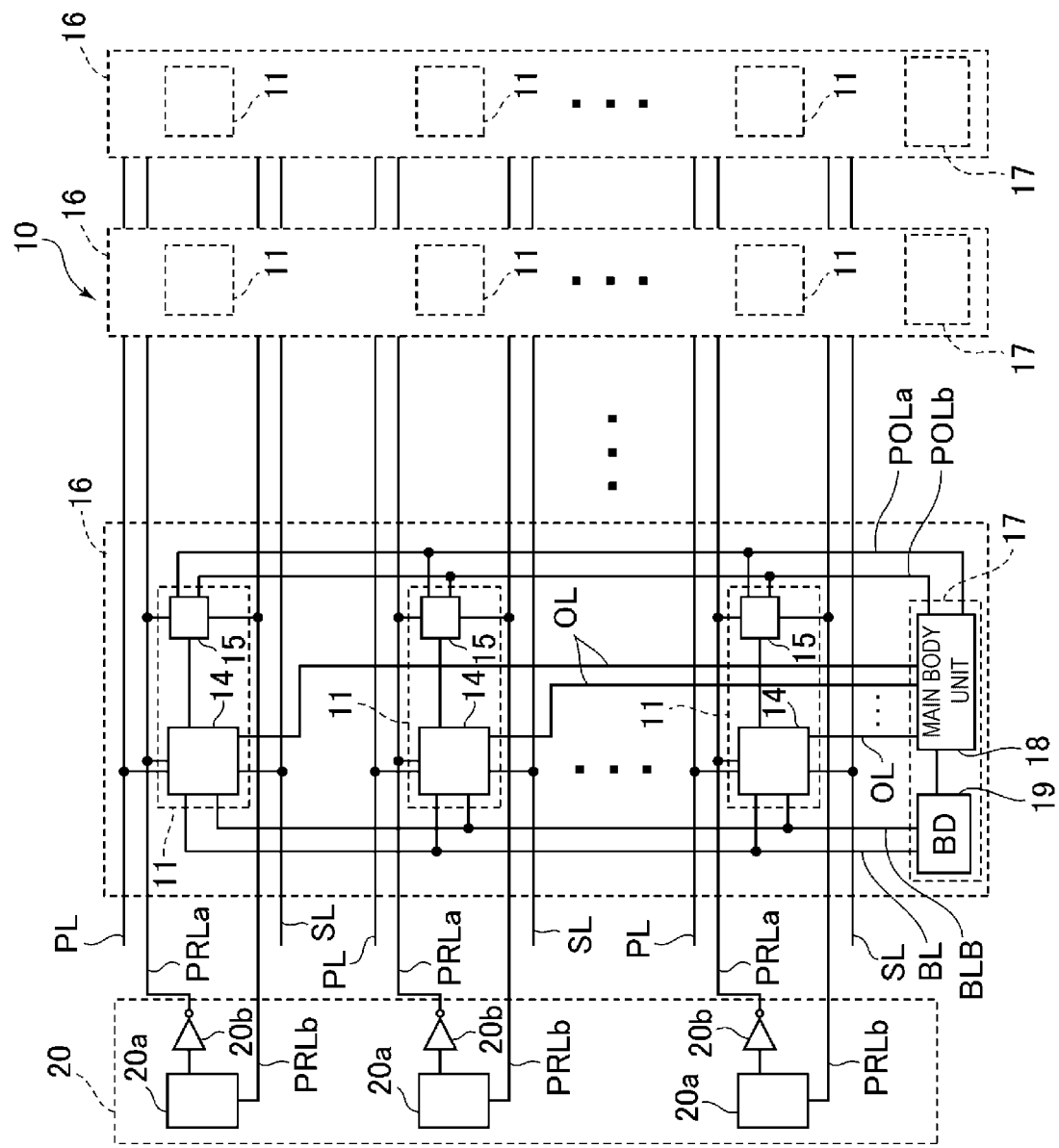
FIG. 1 is a block diagram illustrating an outline of a neural network circuit device of a first embodiment.

In FIG. 1, a neural network circuit device 10 according to a first embodiment is provided with a plurality of synapse circuits 11 arranged in a matrix. Each synapse circuit 11 has a weight memory unit 14 and a selection unit 15. Each column 16 of the synapse circuits 11 is provided with a neuron circuit 17 at the end in the column direction (vertical direction in FIG. 1). The neuron circuit 17 has a main body unit 18 and a bit line driver 19.

Corresponding to each column 16 of the synapse circuits 11, bit lines BL and BLB, a first post-spike line POLa, and a second post-spike line POLb are provided to extend in the column direction. The bit lines BL and BLB are connected to each weight memory unit 14 and the bit line driver 19 in the column 16 to which the bit lines correspond. The first post-spike line POLa and the second post-spike line POLb are connected to each selection unit 15 and the main body unit 18 in the column 16 to which the post-spike lines correspond. An output line OL is provided for each weight memory unit 14, and each weight memory unit 14 is connected to the main body unit 18 of the neuron circuit 17 in the column 16, in which the weight memory unit 14 is arranged, by the respective output line OL.

Corresponding to each row of the synapse circuits 11, a power source line PL that supplies a power source voltage to the weight memory unit 14, a grounded source line SL, a first pre-spike line PRLa, and a second pre-spike line PRLb are provided to extend in the row direction (left and right in the drawing) and are connected to the respective weight memory units 14 in the corresponding rows. The voltage supplied from the power source line PL is about half (=|ΔVB|/2) of the magnitude of a bit line potential difference ΔVB generated between the bit line BL and the bit line BLB as described later. An input circuit 20a is provided in a preceding stage 20 for each row. The first pre-spike line PRLa of each row is connected to the input circuit 20a via an inverter 20b, and the second pre-spike line PRLb is directly connected to the input circuit 20a.

The neural network circuit device 10 refers to a synapse model having spike timing dependent synaptic plasticity (hereinafter, referred to as STDP). In the neural network circuit device 10, the input circuit 20a corresponds to an anterior neuron, the neuron circuit 17 corresponds to a posterior neuron, the input circuit 20a outputs a first pre-spike pulse corresponding to the pre-spike pulse, and the neuron circuit 17 outputs a first post-spike pulses corresponding to the post-spike pulse. The first pre-spike pulse is output at a timing corresponding to the firing timing of the anterior neuron, and the first post-spike pulse is output at a timing corresponding to the firing timing of the posterior neuron. In addition, the synapse circuit 11 corresponds to the synapse that synapse-couples the anterior neuron and the posterior neuron and stores a synaptic coupling weight (hereinafter, simply referred to as the coupling weight).

In the case of paying attention to one synapse, the STDP is a property that the coupling weight with the synapse located between the anterior neuron and the posterior neuron changes depending on the timing at which each of the anterior neuron and the posterior neuron connected before and after the synapse fires and outputs a spike pulse. The neural network circuit device 10 updates the coupling weight of the synapse circuit 11 in a case where a pulse time difference ΔT between the first post-spike pulse and the first pre-spike pulse is within a preset specified time Tw. In a case where the former of the first pre-spike pulse and the first post-spike pulse precedes, the first coupling weight is set, and in a case where the latter precedes, the second coupling weight is set.

Figure 2:
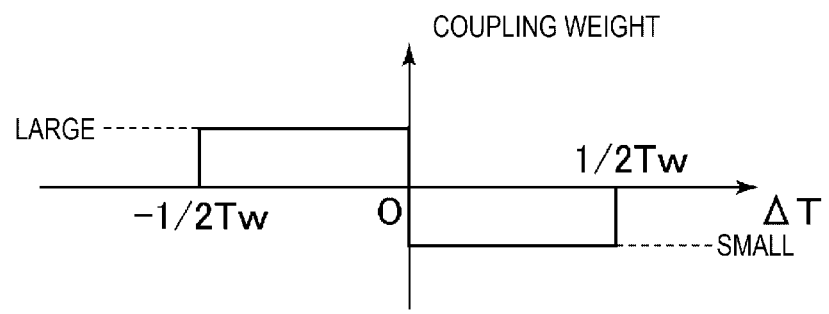
FIG. 2 is a graph showing a relationship between a pulse time difference ΔT between a first post-spike pulse and a first pre-spike pulse and a coupling weight.

In this example, the weighted level of the first coupling weight is relatively large, and the weighted level of the second coupling weight is relatively small. That is, as shown in FIG. 2, in a case where the first pre-spike pulse is input during a period equal to or less than a time of ½ Tw from the time when the first post-spike pulse is output from the neuron circuit 17 to which the synapse circuit 11 is connected, the coupling weight of the synapse circuit 11 becomes a large first coupling weight; and in a case where the first pre-spike pulse is input during a period equal to or less than a time of ½ Tw backwards from the time when the first post-spike pulse is output, the coupling weight of the synapse circuit 11 becomes a small second coupling weight. Therefore, this example is different from the general symmetric STDP and asymmetric STDP in which the coupling weight is gradually increased or gradually decreased by increasing the pulse time difference ΔT in the case of updating the coupling weight.

The neural network circuit device 10 has a recognition mode and a learning mode. The recognition mode is a mode in which an output from each neuron circuit 17 as a processing result according to the result of image recognition is obtained, for example, by inputting a signal corresponding to an image to be processed such as the image recognition from the preceding stage 20 to the neural network circuit device 10, and the coupling weight stored in each synapse circuit 11 in the learning mode is used. The learning mode is an operation mode in which the coupling weight stored in each synapse circuit 11 is updated by inputting a signal based on a prepared image from the preceding stage 20 to the neural network circuit device 10.

The input circuit 20a of the preceding stage 20 outputs the first pre-spike pulse to the first pre-spike line PRLa and a second pre-spike pulse synchronized with the first pre-spike pulse to the second pre-spike line PRLb via the inverter 20b. The first pre-spike pulse is output in both the recognition mode and the learning mode, while the second pre-spike pulse is output only in the learning mode. The second pre-spike pulse is used to control the write timing of the coupling weight of the weight memory unit 14. The pulse width of the second pre-spike pulse is larger than that of the first pre-spike pulse and is ½ of the specified time Tw.

In response to the input of the first pre-spike pulse, the weight memory unit 14 of the synapse circuit 11 outputs a voltage signal Vpre corresponding to the pre-spike pulse weighted by the stored coupling weight via the output line OL to the main body unit 18 of the neuron circuit 17.

The main body unit 18 of the neuron circuit 17 generates the first post-spike pulse in respond to the fact that the sum of the voltage levels of the voltage signals Vpre from the respective weight memory units 14 in the column 16 in which the main body unit 18 is arranged becomes equal to or more than a predetermined threshold value. In the recognition mode, the main body unit 18 outputs the first post-spike pulse to the first post-spike line POLa, and in the learning mode, the main body unit 18 outputs the first post-spike pulse and outputs a second post-spike pulse synchronized with the first post-spike pulse to the second post-spike line POLb. The second post-spike pulse, similarly to the second pre-spike pulse, is used to control the update timing of the coupling weight. The pulse width of the second post-spike pulse is larger than that of the first post-spike pulse and is ½ of the specified time Tw.

In the learning mode, the bit line driver 19 of the neuron circuit 17 controls the potentials of the bit lines BL and BLB in synchronization with the generation of the first post-spike pulse of the main body unit 18 in the same neuron circuit 17. Specifically, at the same time as the first post-spike pulse, during a period substantially equal to the pulse width of the first post-spike pulse, the bit line driver 19 sets a potential VB1 of the bit line BL to be higher than a potential VB2 of the bit line BLB (setting the bit line potential difference ΔVB (=VB1−VB2) to be positive) to allow a current to flow from the bit line BL toward the bit line BLB via the weight memory unit 14; and during a subsequent period of a time of ½ Tw, the bit line driver 19 sets the potential VB2 of the bit line BLB to be higher than the potential VB1 of the bit line BL (setting the bit line potential difference ΔVB to be negative) to allow a current to flow from the bit line BLB toward the bit line BL via the weight memory unit 14.

In the learning mode, the selection unit 15 of the synapse circuit 11 generates a selection signal on the basis of the timings of the first pre-spike pulse, the second pre-spike pulse, the first post-spike pulse, and the second post-spike pulse when the pulse time difference ΔT between the first post-spike pulse and the first pre-spike pulse is within the specified time Tw. The weight memory unit 14 stores the coupling weight based on the potential difference between the bit lines BL and BLB at the timing when the selection signal is input.

Figure 3:
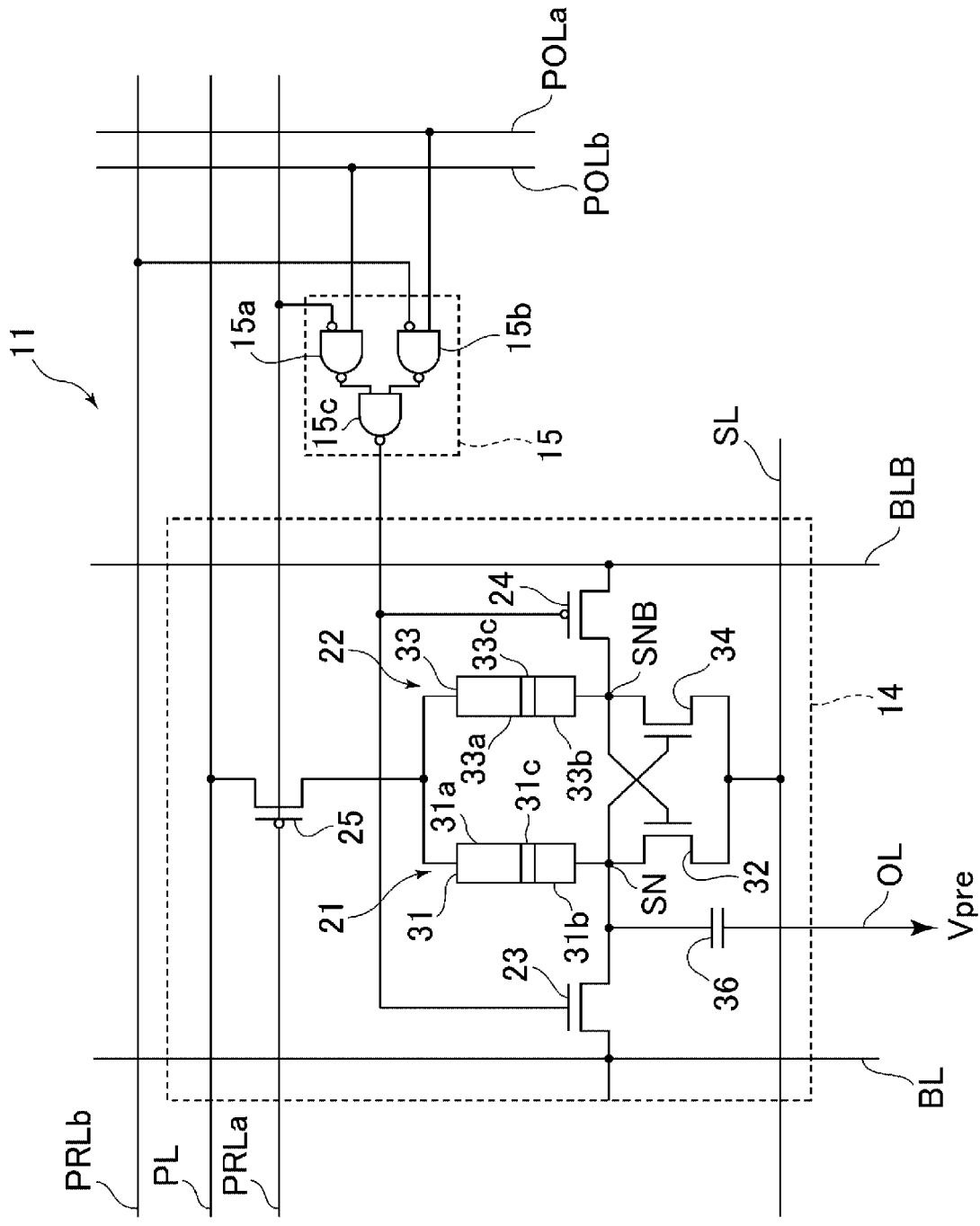
FIG. 3 is a circuit diagram illustrating a configuration of a synapse circuit.

As illustrated in FIG. 3, the weight memory unit 14 of the synapse circuit 11 includes inverters 21 and 22, a pair of MOS transistors 23 and 24 as transfer gates, and a MOS transistor 25. The inverter 21 is configured with an MTJ element (magnetic tunnel junction element) 31 and a MOS transistor 32 which are connected in series, and the inverter 22 is configured with an MTJ element 33 and a MOS transistor 34 which are connected in series. The MOS transistors 23, 24, 32, 34 are N-type MOSFETs, and the MOS transistor 25 is a P-type MOSFET. In this example, the MOS transistors 32 and 34 are inverter MOS transistors, and the MOS transistor 25 is a power gating MOS transistor.

The MTJ element 31 has a structure in which a magnetization fixed layer 31a and a magnetization free layer 31b are stacked with an insulating film 31c interposed therebetween. The magnetization direction of the magnetization fixed layer 31a is fixed. The magnetization free layer 31b can change the magnetization direction by allowing a write current of a predetermined threshold value or more to flow in the MTJ element 31, and the magnetization direction is determined by the direction of the write current. As is well known, the MTJ element 31 becomes a low resistor having a low resistance in the parallel state where the magnetization directions of the magnetization fixed layer 31a and the magnetization free layer 31b are the same, and the MTJ element 31 becomes a high resistor having a high resistance in the antiparallel state where the magnetization direction thereof are opposite. The MTJ element 31 becomes in a parallel state by allowing the write current to flow in the direction from the magnetization fixed layer 31a to the magnetization free layer 31b and becomes in an antiparallel state by allowing the write current in the opposite direction.

The MTJ element 33 also has a configuration in which a magnetization fixed layer 33a, a magnetization free layer 33b, and an insulating film 33c are stacked, and similarly to the MTJ element 31, the magnetization direction of the magnetization free layer 33b can be changed by the write current, so that the resistance value changes in the parallel and antiparallel states.

The weight memory unit 14 stores the coupling weight in a non-volatile manner by the MTJ elements 31 and 33. When one of the MTJ elements 31 and 33 is in a parallel state, the other is in an antiparallel state. In this example, in a case where the first coupling weight is stored, the MTJ element 31 is in a parallel state, the MTJ element 33 is in an antiparallel state, and in a case where the second coupling weight is stored, the MTJ element 31 is in an antiparallel state, and the MTJ element 33 is in a parallel state. The MTJ elements 31 and 33 are advantageous elements from the viewpoint that the maximum number of times of rewriting is considerably large and the number of times of learning can be increased as compared with other ReRAMs, phase change memories, or the like.

The inverter 21 is connected to the magnetization free layer 31b of the MTJ element 31 and the drain of the MOS transistor 32, and the inverter 22 is connected to the magnetization free layer 33b of the MTJ element 33 and the drain of the MOS transistor 34. The magnetization fixed layers 31a and 33a of the MTJ elements 31 and 33 are connected to each other and connected to the power source line PL via the MOS transistor 25. The sources of the MOS transistors 32 and 34 are grounded via the source line SL.

A connection node SN between the MTJ element 31 which is the output terminal of the inverter 21 and the MOS transistor 32 is connected to the gate of the MOS transistor 34 which is the input terminal of the inverter 22, and a connection node SNB between the MTJ element 33 which is the output terminal of the inverter 22 and the MOS transistor 34 is connected to the gate of the MOS transistor 32 which is the input terminal of the inverter 21. Therefore, the inverters 21 and 22 are cross-coupled to constitute a flip-flop, and the MOS transistors 32 and 34 constitute a differential pair.

The connection node SN is connected to the bit line BL via the MOS transistor 23, and the connection node SNB is connected to the bit line BLB via the MOS transistor 24. The gates of the MOS transistors 23 and 24 are connected to the selection unit 15 and is turned on or off by a selection signal from the selection unit 15. The selection unit 15 and the MOS transistors 23 and 24 constitute a writing unit.

In a case where the MOS transistors 23 and 24 are turned on when the bit line potential difference ΔVB is positive, the write current flows in a path from the bit line BL through the connection node SN, the MTJ element 31, the MTJ element 33, and the connection node SNB toward the bit line BLB, so that the MTJ element 31 is in a parallel state and the MTJ element 33 is in an antiparallel state. Conversely, in a case where the MOS transistors 23 and 24 are turned on when the bit line potential difference ΔVB is negative, the write current flows in a path from the bit line BLB through the connection node SNB, the MTJ element 33, the MTJ element 31, and the connection node SN toward the bit line BL, so that the MTJ element 31 is in the antiparallel state and the MTJ element 33 is in the parallel state.

The potential (voltage) of the connection node SN is output to the output line OL as the voltage signal Vpre via a capacitor 36. That is, one electrode of the capacitor 36 is connected to the connection node SN, and the other electrode is connected to a control gate CG (refer to FIG. 4) in the main body unit 18 via the output line OL. As will be described later, the capacitor 36 is provided in order to prevent generation of a conduction current between the weight memory units 14 of the synapse circuits 11 capacitively coupled to the same floating gate FG (refer to FIG. 4) via the control gate CG. The substantial coupling capacitance between the weight memory unit 14 and the floating gate FG is determined by the capacitance of the capacitor 36 and the coupling capacitance of the control gate CG to the floating gate FG. In addition, the weight memory unit 14 and the floating gate FG may also be allowed to have different substantial coupling capacitances, and by doing so, for example, the weighting can be applied to the voltage signal Vpre.

The MOS transistor 25 is a reading unit that outputs the voltage signal Vpre. The MOS transistor 25 is turned on when the gate is connected to the first pre-spike line PRLa and the first pre-spike pulse as an input signal is being output, and the MOS transistors 32 and 34 constituting the inverters 21 and 22, that is, the differential pair are operated. Therefore, in response to the first pre-spike pulse, the voltage of the connection node SN, which is the output terminal of the inverter 21, is output to the output line OL as the voltage signal Vpre. The voltage signal Vpre is low in a case where the MTJ element 31 is relatively in the antiparallel state and the MTJ element 33 is relatively in the parallel state, and the voltage signal Vpre is high in a case where the MTJ element 31 is in the parallel state and the MTJ element 33 is in the antiparallel state.

The selection unit 15 sets the selection signal to be active (H level) by using a combination of logic circuits 15a to 15c when the first pre-spike pulse is output while the second post-spike pulse is being output, or when the second pre-spike pulse is output while the first post-spike pulse is being output. Therefore, the selection signal becomes active and the MOS transistors 23 and 24 are turned on only in a case where the pulse time difference ΔT between the first post-spike pulse and the first pre-spike pulse is within the specified time Tw.

Figure 4:
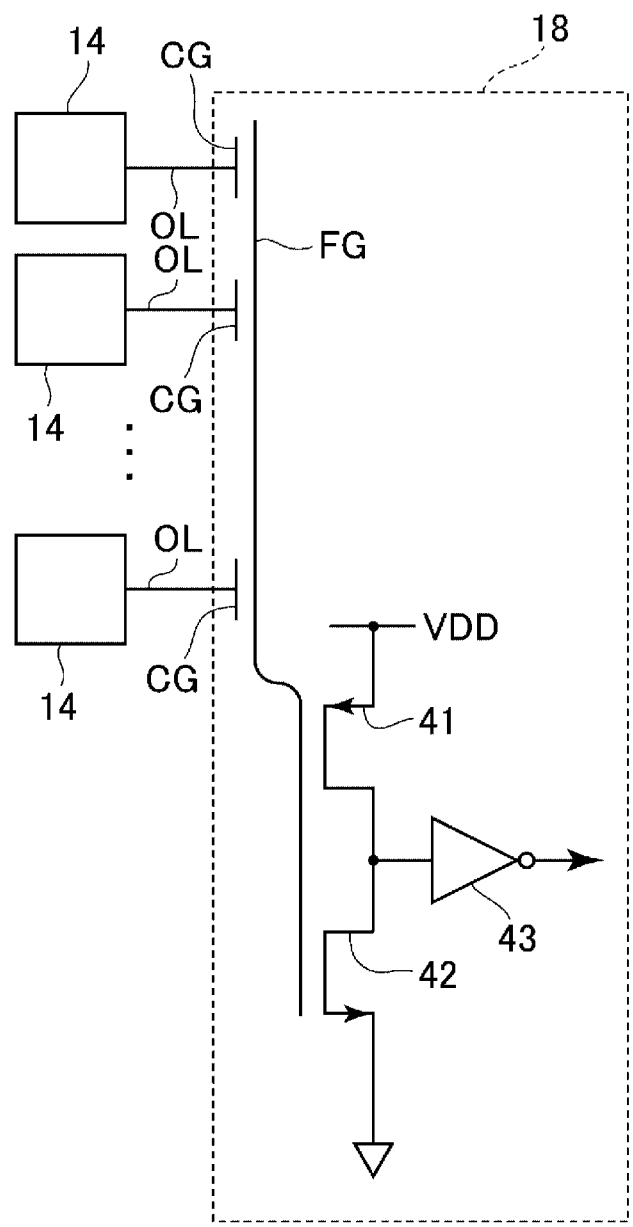
FIG. 4 is a block diagram illustrating a main configuration of a main body unit of a neuron circuit.

In FIG. 4, the main body unit 18 includes a MOS transistor 41 that is a P-type MOSFET, a MOS transistor 42 that is an N-type MOSFET, and a pulse generator 43. In addition to this, the main body unit 18 also includes a pulse generator or the like for generating the second post-spike pulse or the like. In addition, as the pulse generator of the main body unit 18, a pulse generator which can control pulse waveform, output timing, delay time, and the like can be used, so that the first post-spike pulse and the second post-spike pulse may be generated by such a pulse generator. The MOS transistors 41 and 42 as the neuron MOS transistors are connected in series to constitute an inverter. That is, the drains of the MOS transistors 41 and 42 are connected to each other, the source of the MOS transistor 41 is connected to a power source (voltage VDD), and the source of the MOS transistor 42 is grounded. The pulse generator 43 has an input terminal connected to a connection node between the MOS transistor 41 and the MOS transistor 42, and thus, when the connection node becomes the ground potential (0 V), the first post-spike pulse (pulse signal) is output.

The MOS transistors 41 and 42 share the floating gate FG. In addition, the MOS transistors 41 and 42 are provided with a plurality of control gates CG that are capacitively coupled to the floating gate FG. The control gate CG of the main body unit 18 is provided corresponding to each weight memory unit 14 of the column 16 in which the main body unit 18 is arranged, and the output line OL from the corresponding weight storage unit 14 is connected to each control gate CG. The MOS transistors 41 and 42 are controlled to be turned on or off by the potential of the floating gate FG, and when one is turned on, the other is turned off.

The potential of the floating gate FG is determined by the voltage of the voltage signal Vpre applied to each control gate CG and the coupling capacitance between each control gate CG and the floating gate FG. In this example, the coupling capacitance of each control gate CG to the floating gate FG is the same. Therefore, the MOS transistors 41 and 42 can be controlled by the sum of the voltages applied to the respective control gates CG so that one of the MOS transistors 41 and 42 is turned on and the other of the MOS transistors 41 and 42 is turned off.

Figure 5:
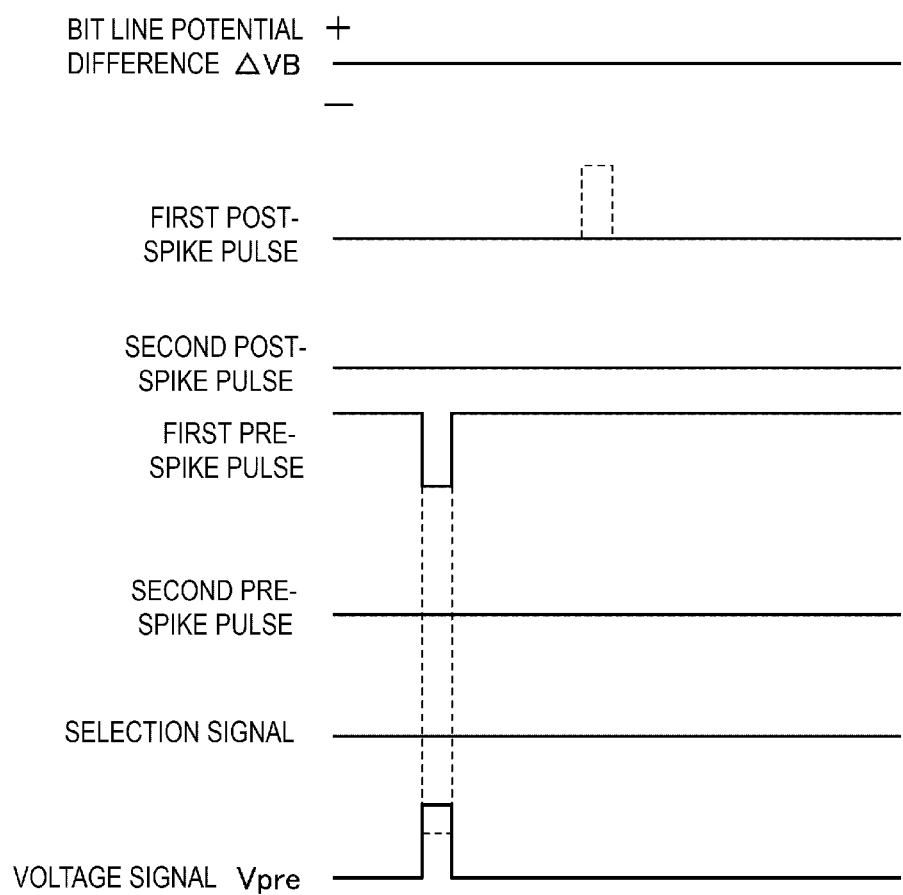
FIG. 5 is a timing chart illustrating various signals in a recognition mode.

Next, the operation of the above-described configuration will be described. In the recognition mode, as illustrated in FIG. 5, at a timing according to the contents of the processing of the preceding stage 20, the first pre-spike pulse is output to the first pre-spike line PRLa from each input circuit 20a via the inverter 20b. In addition, in the recognition mode, since the second pre-spike pulse is not output, the selection unit 15 does not output the selection signal.

With attention paid to one synapse circuit 11 connected to one first pre-spike line PRLa, when the first pre-spike pulse is input to the synapse circuit 11 via the first pre-spike line PRLa, the MOS transistor 25 in the weight memory unit 14 is turned on. When the MOS transistor 25 is turned on, a current from the power source line PL flows in the MTJ element 31 and the MTJ element 33, and thus, the inverters 21 and 22 are operated.

For example, in a case where the coupling weight stored in the synapse circuit 11 is the first coupling weight, that is, in a case where the MTJ element 31 has a low resistance and the MTJ element 33 has a high resistance, a potential difference occurs so that the potential of the connection node SN is higher than the potential of the connection node SNB. The potential difference is amplified by the operation of the cross-coupled inverters 21 and 22 and becomes stable in a state where the potential difference is large. Conversely, in a case where the coupling weight stored in the synapse circuit 11 is the second coupling weight, that is, in a case where the MTJ element 31 has a high resistance and the MTJ element 33 has a low resistance, a potential difference occurs so that the potential of the connection node SN is lower than the potential of the connection node SNB, and the potential difference is amplified by the operation of the cross-coupled inverters 21 and 22 and becomes stable in a state where the potential difference is large.

Since the potential difference between the connection node SN and the connection node SNB is amplified and becomes stable by the differential pair of the MOS transistors 32 and 34, the time required for the stabilization is very short. Therefore, high speed operation becomes possible.

The current flowing in the MTJ elements 31 and 33 when the MOS transistor 25 is turned on is adjusted to a magnitude that does not change the magnetization state. Actually, while the current flows, there is a change in the magnetization direction of the magnetization free layers 31b and 33b, but the change is extremely small to a degree that the generation of a desired potential difference at the connection nodes SN and SNB is not affected. The slight magnetization direction of the magnetization free layers 31b and 33b returns to the original magnetization direction by stopping the current.

As described above, the potential of the connection node SN changes according to the coupling weight stored in the synapse circuit 11. As a result, in a case where the synapse circuit 11 stores the first coupling weight, the voltage signal Vpre having a high voltage is output to the output line OL connected to the connection node SN via the capacitor 36, and in a case where the second coupling weight is stored, the voltage signal Vpre having a low voltage is output. The voltage signal Vpre from the synapse circuit 11 is applied to the control gate CG of the main body unit 18 via the output line OL. In addition, when the MOS transistor 25 is turned off, the capacitor 36 discharges and the voltage of the voltage signal Vpre drops. However, since the capacitor 36 discharges through the MTJ elements 31 and 33, the MOS transistors 32 and 34, or the like, the voltage of the voltage signal Vpre is gradually decreased and does not immediately reach 0 V.

With attention paid to one neuron circuit 17, the voltage of the voltage signal Vpre output from each synapse circuit 11 in the column 16 where the neuron circuit 17 is arranged is applied to the corresponding control gate CG. Of course, no voltage is applied to the control gate CG from the synapse circuit 11 to which the first pre-spike pulse is not input. As described above, when the voltage of the voltage signal Vpre is applied to each control gate CG and the potential of the floating gate FG reaches the threshold value, the MOS transistor 41 is turned off, and the MOS transistor 42 is turned on. As a result, the first post-spike pulse is output from the pulse generator 43. When the potential of the floating gate FG does not reach the threshold value, the MOS transistor 41 is not turned off, and the MOS transistor 42 is not turned on, so that the first post-spike pulse is not output.

As described above, according to the timing of the first pre-spike pulse output from the preceding stage 20 to the first pre-spike line PRLa of each row and the coupling weight stored in each synapse circuit 11, the first post-spike signal is output from the neuron circuit 17 provided for each column 16.

In the recognition mode, the weighted level applied to the pre-spikes is transmitted from the weight memory unit 14 to the main body unit 18 as the magnitude of the voltage of the voltage signal Vpre, and the sum of the voltages is obtained by the capacitively coupled control gate CG and floating gate FG. For this reason, without providing an arithmetic circuit for calculating the product sum of the coupling weights and the pre-spike pulses, the first post-spike pulse corresponding to the post-spike pulse according to the result of the product sum calculation can be obtained. In addition, since only a very small current for charging the control gate CG (actually, the capacitor 36) flows, the operation at a low power is possible. In addition, in the weight memory unit 14, the two MTJ elements 31 and 33 are always written with the resistance states opposite to each other. For this reason, when the voltage signal Vpre is output, a current flows in one (high resistance) of the MTJ elements, and almost no current flows in the other (low resistance) of the MTJ elements. The direction of the current flowing in the one (high resistance) MTJ element is the direction of the write current that allows the MTJ element to have a high resistance. Therefore, in either the MTJ element having a high resistance or the MTJ element having a low resistance, the read disturb does not occur in which the direction of magnetization is reversed by the current flowing when the voltage signal Vpre is output.

Figure 6:
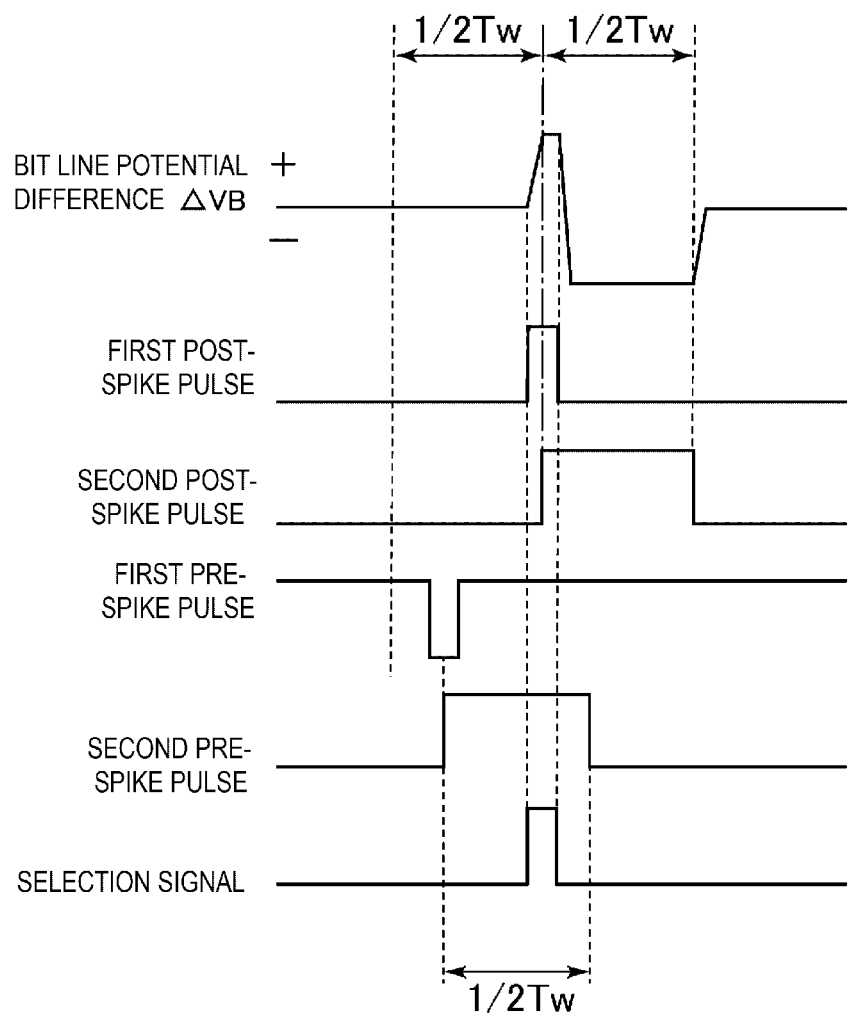
FIG. 6 is a timing chart illustrating various signals in a learning mode in a case where the first pre-spike pulse precedes.
Figure 7:
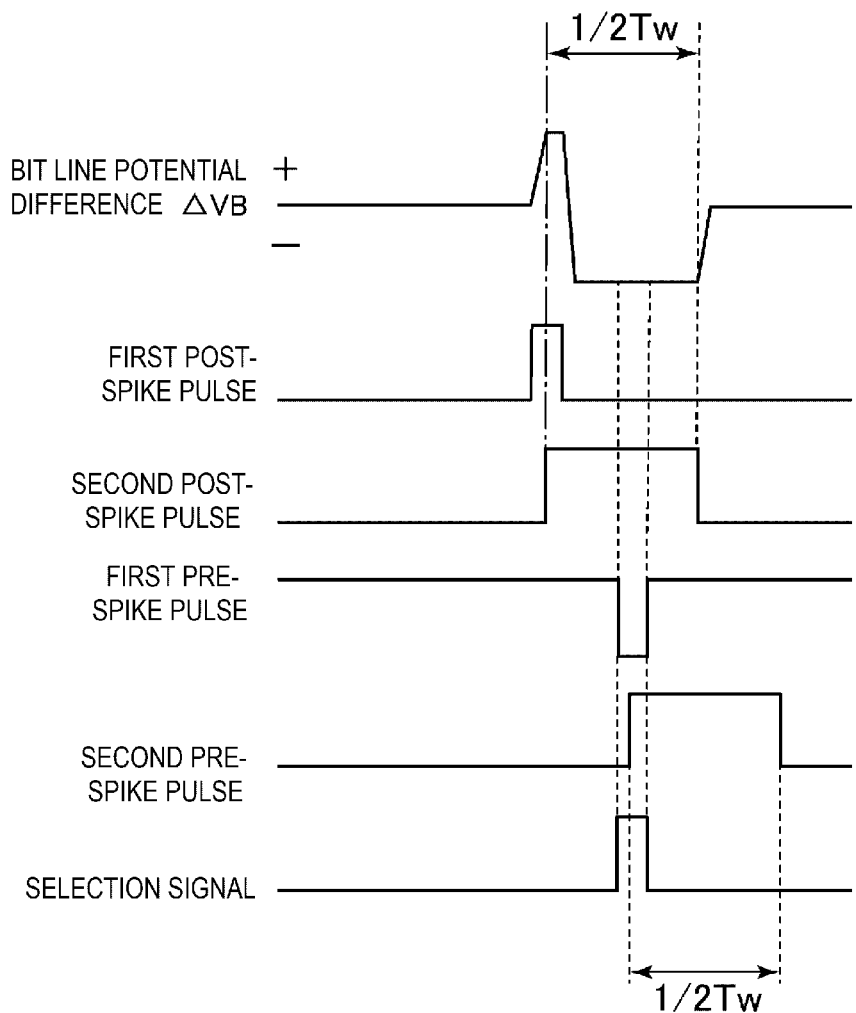
FIG. 7 is a timing chart illustrating various signals in a learning mode in a case where the first post-spike pulse precedes.

In the learning mode, similarly to the recognition mode, the first pre-spike pulse is output to the first pre-spike line PRLa from each input circuit 20a at a timing according to the content of the processing of the preceding stage 20. Also in the learning mode, when the first pre-spike pulse is output, similarly to the case of the recognition mode, the weight memory unit 14 operates, and the voltage signal Vpre is output. In the learning mode, as illustrated in FIGS. 6 and 7, the second pre-spike pulse having a pulse width of ½ Tw is output from the input circuit 20a to the second pre-spike line PRLb in synchronization with the first pre-spike pulse. In addition, FIG. 6 illustrates the case where the first pre-spike pulse precedes the first post-spike pulse, and FIG. 7 illustrates the case where the first post-spike pulse precedes the first pre-spike pulse.

Similarly to the recognition mode, the synapse circuit 11 to which the first pre-spike pulse is input via the first pre-spike line PRLa outputs the voltage signal Vpre corresponding to the coupling weight stored in the weight memory unit 14 of the synapse circuit 11 to the main body unit 18 arranged in the same column 16. Also in the main body unit 18, when the voltage of the voltage signal Vpre is applied to the control gate CG and the potential of the floating gate FG reaches the threshold value, the MOS transistor 41 is turned off, and the MOS transistor 42 is turned on. As a result, the first post-spike pulse is output from the pulse generator 43 to the first post-spike line POLa. In addition, when the first post-spike pulse is output, the second pre-spike pulse having a pulse width of ½ Tw is output from the main body unit 18 to the second pre-spike line PRLb in synchronization with the first post-spike pulse.

At the same time as the output of the first post-spike pulse, the bit line driver 19 sets the bit line potential difference ΔVB to be positive during a period substantially the same as the pulse width of the first post-spike pulse, and sets the bit line potential difference ΔVB to be negative during the subsequent period of ½ Tw.

For example, as illustrated in FIG. 6, in the synapse circuit 11 to which the first pre-spike pulse is input within a period that is traced back by a time of ½ Tw from the timing at which the first post-spike pulse is output, the first post-spike pulse is input to the selection unit 15 while the second pre-spike pulse is input. For this reason, substantially at the same time as the first post-spike pulse, the selection signal is output to the weight storage unit 14, and the MOS transistors 23 and 24 in the weight memory unit 14 are turned on during the period when the bit line potential difference ΔVB is positive.

When the MOS transistors 23 and 24 are turned on as described above, the potential of the bit line BL is higher than that of the bit line BLB, so that the write current flows in a path from the bit line BL through the MOS transistor 23, the MTJ element 31, the MTJ element 33, and the MOS transistor 24 toward the bit line BLB. At this time, since the write current flows from the magnetization free layer 31b of the MTJ element 31 to the magnetization fixed layer 31a and from the magnetization fixed layer 33a of the MTJ element 33 to the magnetization free layer 33b, the MTJ element 31 has a low resistance, and the MTJ element 33 has a high resistance. As a result, the synapse circuit 11 is in a state where the first coupling weight is stored.

When the pulse time difference $\Delta T$ is equal to or less than ½ Tw and the first pre-spike pulse precedes the first post-spike pulse, as described above, the MOS transistor 25 is turned on at the same time as the MOS transistors 23 and 24. On the other hand, the voltage of the power source line PL is set to about $|\Delta VB|/2$ as described above. For this reason, even if the MOS transistor 25 is turned on at the same time as the MOS transistors 23 and 24, a potential difference is generated between the bit line BL and the power source line PL and between the power source line PL and the bit line BLB, so that the write current flows as described above, and thus, a state where the first coupling weight is stored by the MTJ elements 31 and 33 is obtained.

On the other hand, as illustrated in FIG. 7, in the synapse circuit 11 to which the first pre-spike pulse is input within a period from the time of the output of the first post-spike pulse to the time when the time of ½ Tw elapses, the first pre-spike pulse is input to the selection unit 15 while the second post-spike pulse is input. For this reason, since the selection signal is output to the weight memory unit 14 substantially at the same time as the first pre-spike pulse, during a period when the bit line potential difference $\Delta VB$ is negative, the MOS transistors 23 and 24 in the weight memory unit 14 are turned on.

When the MOS transistors 23 and 24 are turned on as described above, the potential of the bit line BLB is higher than that of the bit line BL, so that the write current flows in a path from the bit line BLB through the MOS transistor 24, the MTJ element 33, the MTJ element 31, and the MOS transistor 23 toward the bit line BL. At this time, since the write current flows from the magnetization fixed layer 31a of the MTJ element 31 to the magnetization free layer 31b and from the magnetization free layer 33b of the MTJ element 33 to the magnetization fixed layer 33a, the MTJ element 31 has a high resistance, and the MTJ element 33 has a low resistance. As a result, the synapse circuit 11 is in a state where the second coupling weight is stored.

The synapse circuit 11 rewrites the coupling weight as described above, and when the first pre-spike pulse is input after the rewriting, the synapse circuit 11 outputs the voltage signal Vpre corresponding to the new coupling weight to the neuron circuit 17 as described above. In addition, when the potential of the floating gate FG reaches the threshold value, the neuron circuit 17 outputs the first post-spike pulse and the second post-spike pulse as described above. Then, when the first pre-spike pulse is input within each period of a time of ½ Tw before and after the timing when the first post-spike pulse is input, each synapse circuit 11 rewrites the coupling weight again. As described above, the coupling weight of each synapse circuit 11 is updated, and the final coupling weight is held in each synapse circuit 11.

As described above, in the learning mode, the magnetization states of the MTJ elements 31 and 33 are changed by allowing the write current to flow. However, since the time (hereinafter, rewriting time) required to change the MTJ elements 31 and 33 between the parallel state and the antiparallel state is very short, a high speed operation is possible. For example, the rewriting time of the MTJ elements 31 and 33 is about 1/10 of that of the ReRAM.

As described above, in either the recognition mode or the learning mode, the neural network circuit device 10 can operate at a high speed and a low power and has a more optimal configuration.

Figure 8:
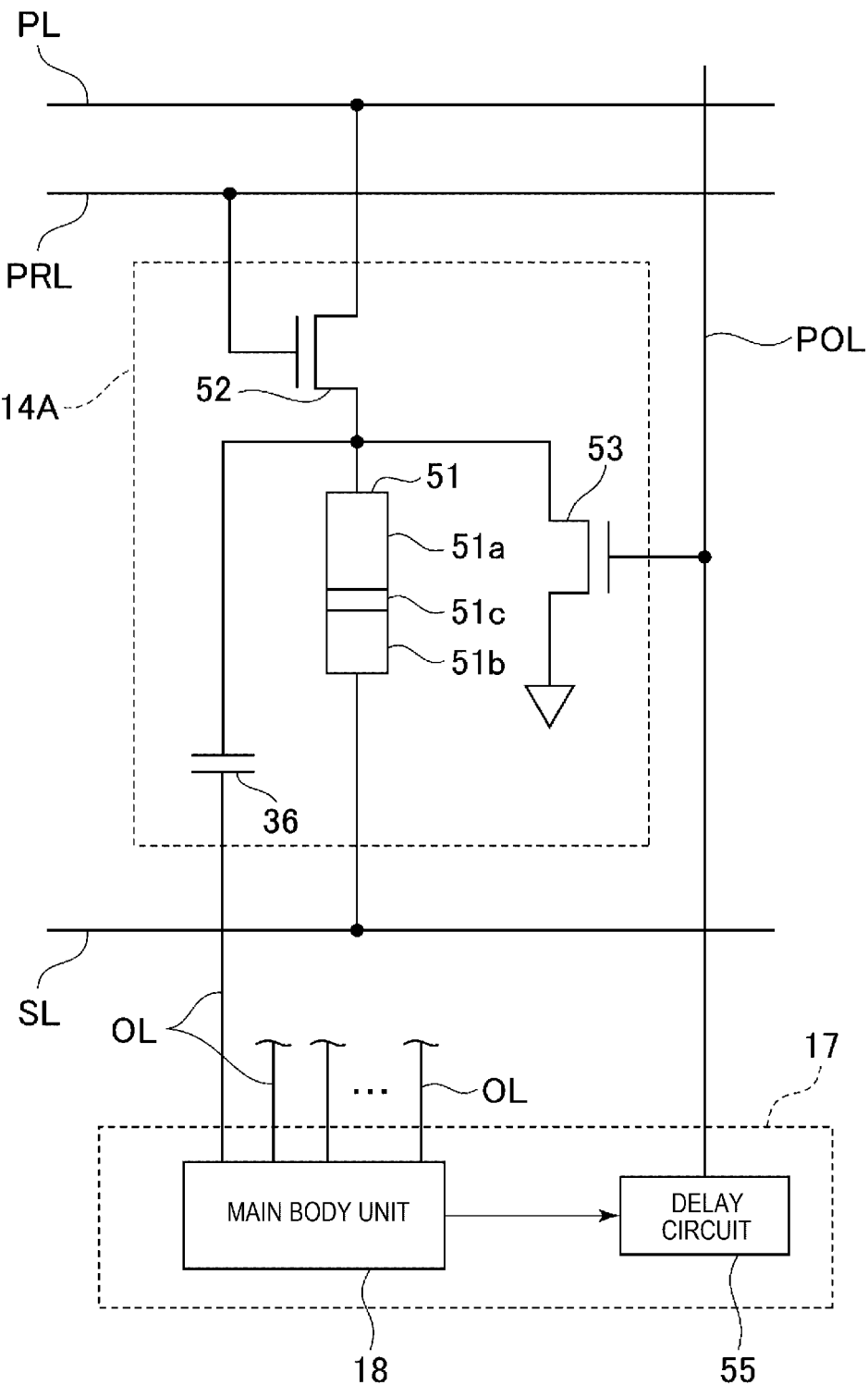
FIG. 8 is a circuit diagram illustrating an example of a weight storage unit using one MTJ element.

The weight storage unit has a configuration in which a pair of inverters each including an MTJ element are cross-coupled, but a circuit configuration in which only one MTJ element is used can be employed. A weight memory unit 14A illustrated in FIG. 8 includes an MTJ element 51 and MOS transistors 52 and 53 that are N-type MOSFETs. Like the MTJ elements 31 and 33 (refer to FIG. 3), the MTJ element 51 has a structure in which a magnetization fixed layer 51a and a magnetization free layer 51b are stacked with an insulating film 51c interposed therebetween. The weight memory unit 14A stores the magnitude of the coupling weight according to the magnitude of the resistance of the MTJ element 51 (direction of magnetization of the magnetization free layer 51b).

In the MTJ element 51, the magnetization fixed layer 51a is connected to the power source line PL via the MOS transistor 52, and the magnetization free layer 51b is connected to the source line SL. The gate of the MOS transistor 52 is connected to the pre-spike line PRL provided to extend in the row direction. The pre-spike pulse is output to the pre-spike line PRL from the input circuit at the preceding stage. In this example, an H level pre-spike pulse is output to the pre-spike line PRL. A potential VSL of the source line SL is controlled by, for example, an input circuit. In the learning mode, the source line potential VSL is normally set to the ground level, but when a spike pulse is output from the input circuit, the source line potential changes in synchronization with the spike pulse. In addition, in the recognition mode, the source line potential VSL is maintained at the ground level.

The connection node between the MTJ element 51 and the MOS transistor 52 is grounded via the MOS transistor 53. The gate of the MOS transistor 53 is connected to a post-spike line POL provided to extend in the column direction. The neuron circuit 17 has the main body unit 18 and a delay circuit 55, and the main body unit 18 outputs a post-spike pulse to the post-spike line POL via the delay circuit 55. The delay circuit 55 delays the post-spike pulse by a time of ½ Tw.

In the weight memory unit 14A, the potential (voltage) of the connection node between the MTJ element 51 and the MOS transistor 52 is output to the output line OL via the capacitor 36 as the voltage signal Vpre. That is, one electrode of the capacitor 36 is connected to the connection node between the MTJ element 51 and the MOS transistor 52, and the other electrode is connected to the control gate in the main body unit 18 via the output line OL.

Figure 9:
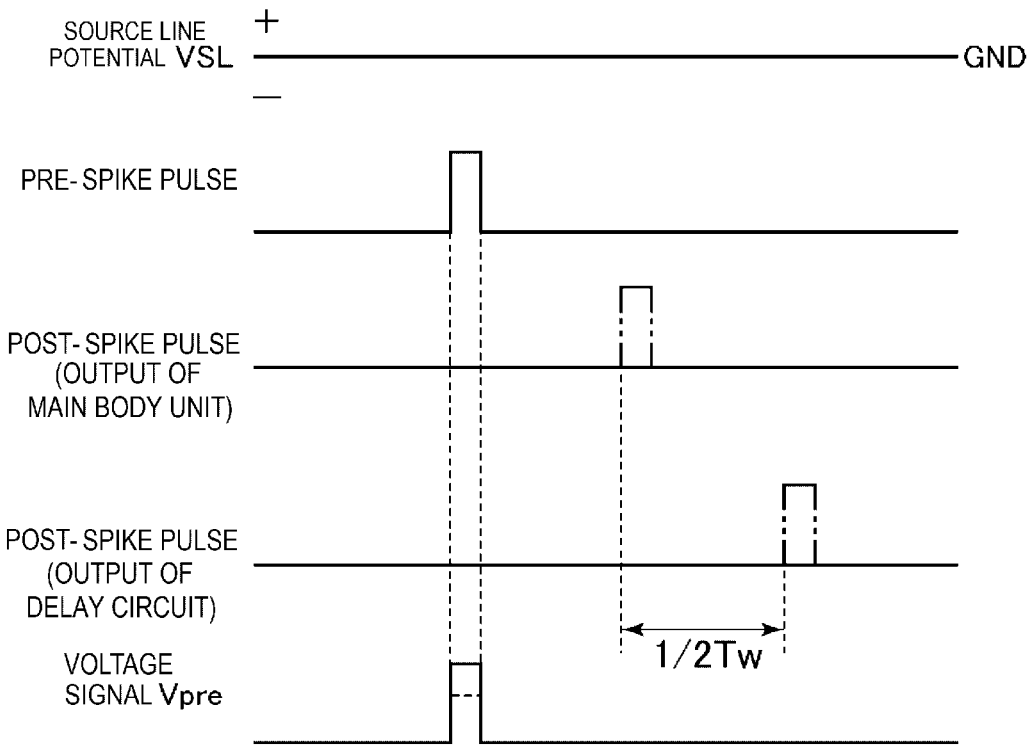
FIG. 9 is a timing chart illustrating various signals in a recognition mode in the example of FIG. 8.

According to the above-described configuration, in the recognition mode, as illustrated in FIG. 9, the source line potential VSL is continuously set to the ground level (0 V). In this state, when the pre-spike pulse is output from the input circuit of the preceding stage and the MOS transistor 52 is turned on, a current flows from the power source line PL to the source line SL via the MTJ element 51. Therefore, the voltage signal Vpre having a voltage equal to the voltage drop corresponding to the resistance value of the MTJ element 51 is output from the connection node between the MTJ element 51 and the MOS transistor 52 to the main body unit 18 of the neuron circuit 17 via the capacitor 36. In this manner, the weight memory unit 14A outputs the voltage signal Vpre having a voltage corresponding to the stored coupling weight in response to the input of the pre-spike pulse. For example, when the MTJ element 51 is in the parallel state (low resistance), the voltage of the voltage signal Vpre becomes low; and when the MTJ element 51 is in the antiparallel state (high resistance), the voltage of the voltage signal Vpre becomes high.

Figure 10:
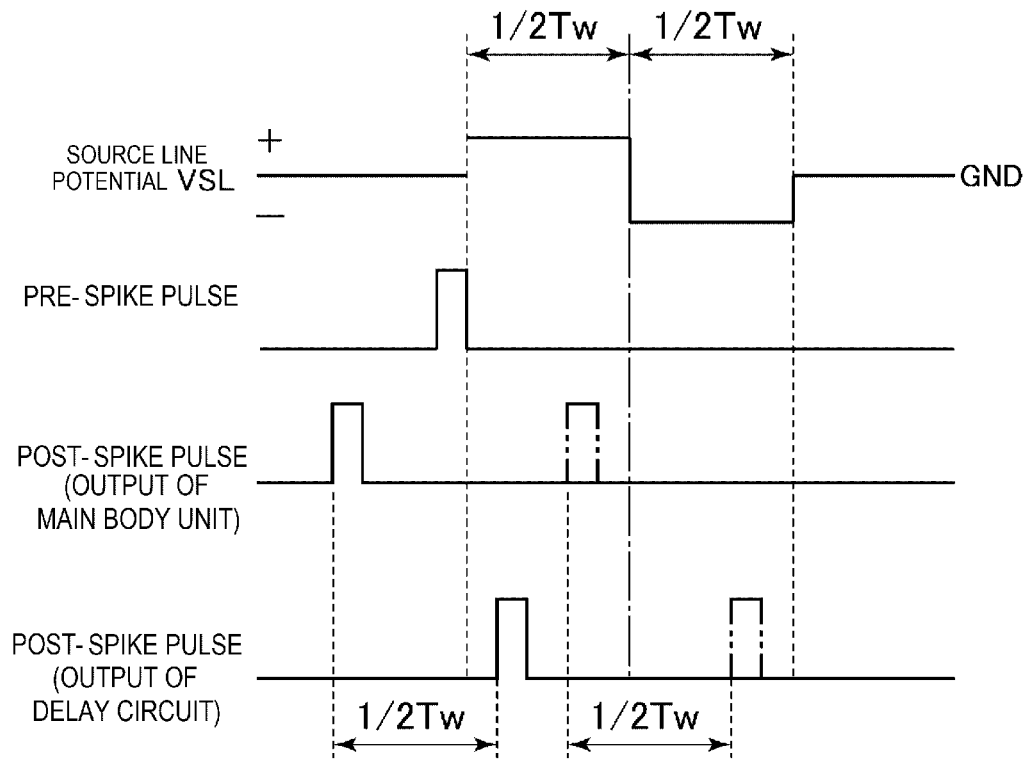
FIG. 10 is a timing chart illustrating various signals in a learning mode in the example of FIG. 8.

Also in the learning mode, when the pre-spike pulse is output from the input circuit of the preceding stage, similarly to the recognition mode, the weight memory unit 14A operates, and thus, the voltage signal Vpre is output. In the learning mode, as illustrated in FIG. 10, the source line potential VSL is controlled in synchronization with the pre-spike pulse. First, the source line potential VSL becomes higher than the ground level during a period (hereinafter, referred to as a first period) of a time of ½ Tw from the time when the pre-spike pulse falls; and the source line potential VSL becomes lower than the ground level during a subsequent period (hereinafter, referred to as a second period) of a time of ½ Tw. The magnitude (absolute value) of the source line potential VSL with respect to the ground level at this time is determined so that the write current required for changing the magnetization state of the MTJ element 51 can be allowed to flow in the MTJ element 51.

When the main body unit 18 outputs the post-spike pulse, the MOS transistor 53 is turned on by the post-spike pulse via the delay circuit 55. Therefore, the MTJ element 51 is in a state of being connected between the source line SL and the ground. For this reason, when the MOS transistor 53 is turned on during the period when the source line potential VSL is controlled, the write current in the direction corresponding to the source line potential VSL flows in the MTJ element 51.

As described above, the delay circuit 55 delays the output of the post-spike pulse by a time of ½ Tw. For this reason, for example, as illustrated by the solid line in FIG. 10, in a case where the pulse time difference ΔT between the post-spike pulse from the main body unit 18 and the pre-spike pulse is equal to or less than ½ Tw, and in a case where the post-spike pulse precedes, the post-spike pulse is output from the delay circuit 55 within the first period. In this case, since the MOS transistor 53 is turned on when the source line potential VSL is higher than the ground level, the write current flows from the magnetization free layer 51b toward the magnetization fixed layer 51a in the MTJ element 51. As a result, the MTJ element 51 becomes a parallel state.

On the other hand, as illustrated by the chain double-dashed line in FIG. 10, in a case where the pulse time difference ΔT between the post-spike pulse from the main body unit 18 and the pre-spike pulse is equal to or less than ½ Tw, and in a case where the pre-spike pulse precedes, the post-spike pulse is output from the delay circuit 55 within the second period. In this case, since the MOS transistor 53 is turned on when the source line potential VSL is lower than the ground level, the write current flows in the MTJ element from the magnetization fixed layer 51a toward the magnetization free layer 51b. As a result, the MTJ element 51 becomes an antiparallel state.

In each of the above examples, the weight storage unit is configured by using a two-terminal type MTJ element of a spin transfer torque (STT) scheme, but the method of magnetization inversion of the MTJ element, the number of terminals, and the like are not limited thereto. For example, a three-terminal type MTJ element of a spin orbital torque (SOT) inversion scheme may be used.

Figure 11:
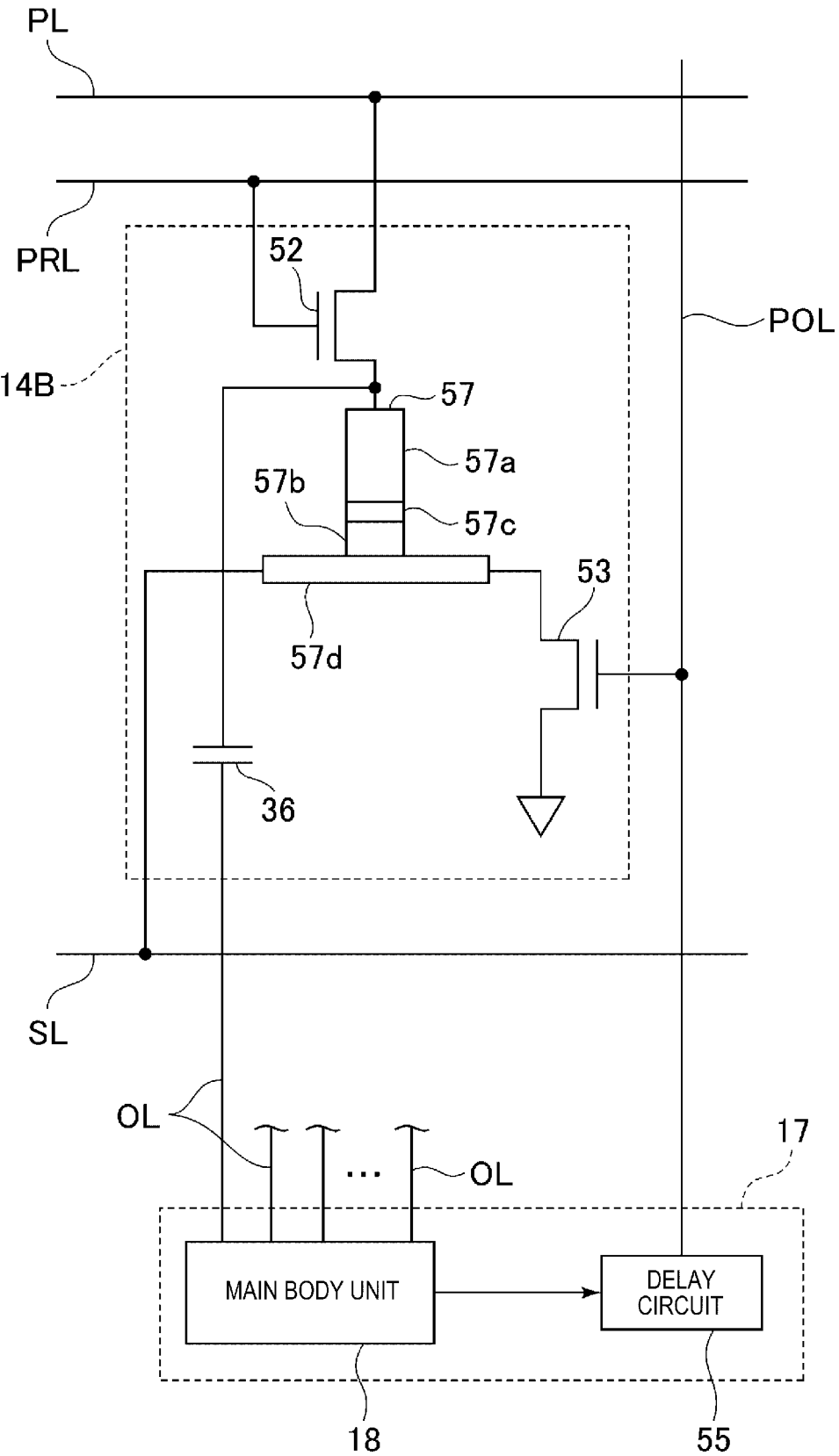
FIG. 11 is a circuit diagram illustrating an example of a weight storage unit using a 3-terminal MTJ element.

FIG. 11 illustrates an example of a weight storage unit 14B using a three-terminal MTJ element 57. The MTJ element 57 has a structure in which a stacked body where a magnetization fixed layer 57a and a magnetization free layer 57b are stacked with an insulating film 57c interposed is provided on a channel layer 57d. The stacked body has, from the channel layer 57d side, the magnetization free layer 57b, the insulating film 57c, and the magnetization fixed layer 57a stacked in this order. The magnetization fixed layer 57a and the magnetization free layer 57b are made of a ferromagnetic material. The insulating film 57c is made of a nonmagnetic insulator. The channel layer 57d is a conductive layer containing an antiferromagnetic material, and the channel layer 57d is formed in a plate shape extending in one direction. The stacked body is provided at the central portion of one surface of the channel layer 57d.

The magnetization fixed layer 57a has a magnetization direction fixed in one direction, for example, in a direction perpendicular to the film surface (vertical direction in FIG. 11), and the magnetization free layer 57b has an axis of easy magnetization in a direction perpendicular to the film surface, so that the magnetization direction can be changed to any of the parallel state in which the magnetization direction is the same as that of the magnetization fixed layer 57a and the antiparallel state in which the magnetization direction is the opposite direction. The magnetization directions of the magnetization fixed layer 57a and the magnetization free layer 57b may be parallel to the film surface.

The MTJ element 57 can change the magnetization direction of the magnetization free layer 57b by the action of a spin orbit torque generated by allowing the write current to flow in the extending direction of the channel layer 57d. The magnetization direction of the magnetization free layer 57b corresponds to the direction of the write current. That is, when the write current flows in the channel layer 57d, a spin current corresponding to the direction of the write current is generated in the inside of the channel layer 57d in a direction perpendicular to the film surface, and the spin orbit torque acts on the magnetization free layer 57b. This spin orbit torque acts on the magnetization free layer 57b to which the steady magnetic field from the channel layer 57d is applied, so that the magnetization direction of the magnetization free layer 57b is changed to any of the same direction (parallel state) as that of the magnetization fixed layer 57a and the opposite direction (antiparallel state) according to the direction of the spin current.

By applying a read voltage to the stacked body to allow the read current in a direction passing through the stacked body to flow, the MTJ element 57 can determine the level of the resistance of the MTJ element 57 (stacked body) from the read voltage and the read current. In this example, similarly to the above-described examples, the voltage signal Vpre having a voltage corresponding to the magnetization state (resistance value) of the MTJ element 57 is extracted.

In this example, in the upper surface (the surface opposite to the surface on which the insulating film 57c is formed) of the magnetization fixed layer 57a, one end and the other end in the extending direction of the channel layer 57d are used as terminals of the MTJ element 57, respectively, the upper surface of the magnetization fixed layer 57a is connected to the power source line PL via the MOS transistor 52, one end of the channel layer 57d is grounded via the MOS transistor 53, and the other end is connected to the source line SL.

The weight memory unit 14B outputs the potential (voltage) of the connection node between the MOS transistor 52 and the MTJ element 57 (the upper surface of the magnetization fixed layer 57a) to the output line OL via the capacitor 36 as the voltage signal Vpre. That is, one electrode of the capacitor 36 is connected to the connection node between the MTJ element 57 and the MOS transistor 52, and the other electrode is connected to the control gate in the main body unit 18 via the output line OL. In addition, other circuit configurations, control of the source line potential VSL, and the like are the same as those in the example of FIG. 9.

In the weight storage unit 14B, the MOS transistor 52 is turned on in response to the pre-spike pulse, so that a current flows in the source line SL connected to the other end of the channel layer 57d from the upper surface of the magnetization fixed layer 57a via the stacked body. Therefore, the voltage signal Vpre having a voltage equal to the voltage drop corresponding to the resistance value of the MTJ element 57 is output from the connection node between the MTJ element 57 and the MOS transistor 52 to the main body unit 18 of the neuron circuit 17 via the capacitor 36.

In a case where the pulse time difference ΔT is equal to or less than a time of ½ Tw and the MOS transistor 53 is turned on in response to the post-spike pulse from the delay circuit 55, the write current flows in the channel layer 57d connected between the source line SL and the ground, so that the magnetization direction of the magnetization free layer 57b is updated. At this time, depending on the timing when the MOS transistor 53 is turned on, that is, whether the post-spike pulse precedes or the pre-spike pulse precedes, the direction of the write current flowing in the channel layer 57d changes so that the magnetization direction of the magnetization free layer 57b becomes the magnetization direction according to the direction of the write current.

Like the weight memory unit 14 illustrated in FIG. 3, the cross-coupled inverter may be configured with a three-terminal type MTJ element and a MOS transistor.

As a memory element that stores the coupling weight in a non-volatile manner, the storage element is not limited to the MTJ element. As such a storage element, one that stores data by using a difference in electric resistance can be preferably used. For example, there may be exemplified a phase change element in which data is rewritten by changing the phase state of a phase change material by Joule heat generated when a current is allowed to flow in a phase change material layer which is used for a phase change memory (phase change random access memory (PCRAM)), a resistance change element which changes a resistance value of an oxide layer of the weight storage unit by application of a voltage pulse, and which is used for resistive random access memory (resistive RAM (ReRAM)) or the like. In addition, as a memory element that stores a coupling weight in a non-volatile manner, a ferroelectric storage element having a ferroelectric capacitor used in a ferroelectric memory (ferroelectric random access memory) can also be used.

Second Embodiment

In a second embodiment, the coupling weight of the synapse circuit is represented by the magnitude of the current. In addition, except for the following description, the second embodiment is similar to the first embodiment, the same members are denoted by the same reference numerals, and detailed description thereof is omitted.

Figure 12:
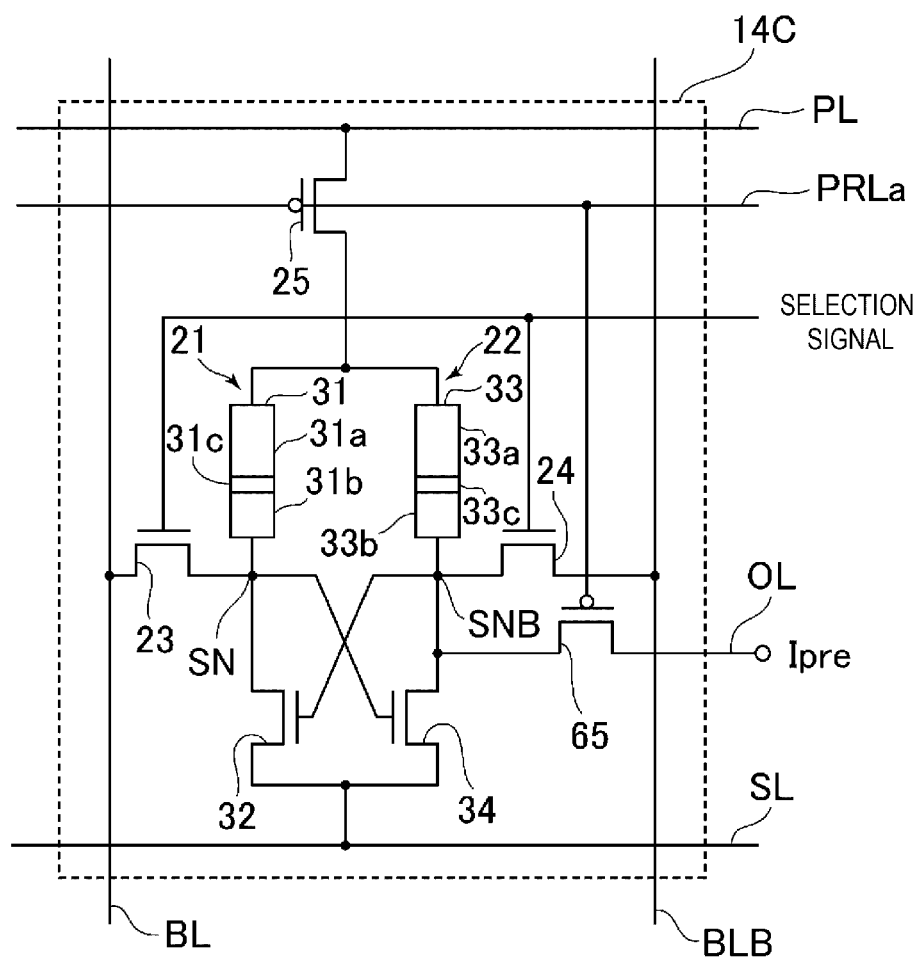
FIG. 12 is a circuit diagram illustrating a weight storage unit of a second embodiment.

As illustrated in FIG. 12, a weight memory unit 14C of the synapse circuit has inverters 21 and 22, a pair of MOS transistors 23 and 24 that are transfer gates, and a power gating MOS transistor 25, and the inverters 21 and 22 are configured with respective MTJ elements 31 and 33 and respective MOS transistors 32 and 34. In this example, as a reading unit, a MOS transistor 65 is provided together with the MOS transistor 25. The MOS transistor 65 is a P-type MOSFET, the source is connected to the connection node SNB which is the output terminal of the inverter 22, and the drain is connected to the output line OL. The gate of the MOS transistor 65 is connected to the first pre-spike line PRLa, and thus, the MOS transistor 65 is turned on together with the MOS transistor 25 by the first pre-spike pulse.

Figure 13:
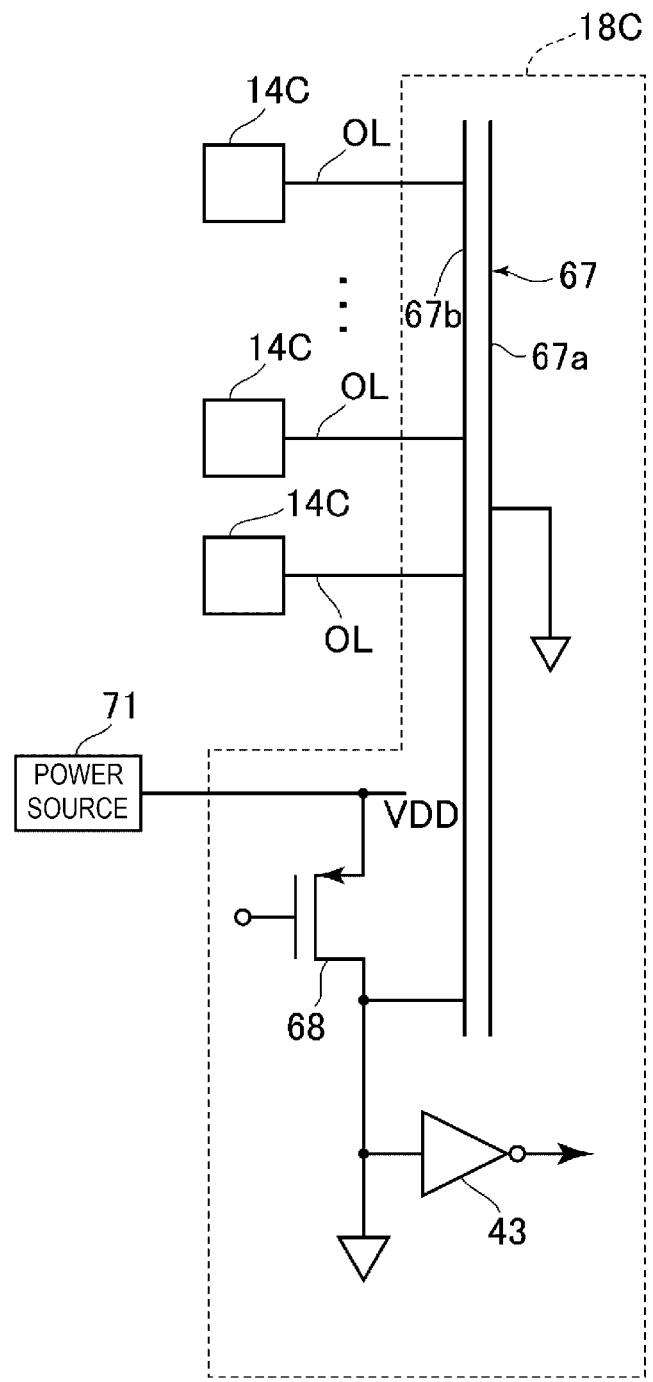
FIG. 13 is a block diagram illustrating a main configuration of a main body unit of a neuron circuit of the second embodiment.

In FIG. 13, a main body unit 18C of the neuron circuit includes a capacitor 67, a MOS transistor 68 as a load, and a pulse generator 43. In the capacitor 67, one of electrodes 67a and 67b facing each other is grounded. In addition, the other electrode 67b of the capacitor 67 is connected to the weight memory unit 14C of each synapse circuit in the column in which the neuron circuit is arranged via the output line OL. In addition, the electrode 67b is connected to the input terminal of the pulse generator 43 and is also connected to a power source 71 via the MOS transistor 68.

The MOS transistor 68 is a P-type MOSFET, the source is connected to the power source 71, and the drain is connected to the electrode 67b. A predetermined gate voltage is applied to the MOS transistor 68, and thus, a current from the power source 71 flows so as to charge the capacitor 67.

According to the above-described configuration, in either the recognition mode or the learning mode, the capacitor 67 is charged by the current from the power source 71. For this reason, in a state where the first pre-spike pulse is not input to the weight memory unit 14C, the electrode 67b is maintained at the same output potential (output voltage) of the power source.

When the first pre-spike pulse from the input circuit at the preceding stage is input to the weight memory unit 14C via the first pre-spike line PRLa, each of the MOS transistors 25 and 65 of the weight memory unit 14C is turned on. When the MOS transistor 25 is turned on, the cross-coupled inverters 21 and 22 are operated, the potential difference generated between the connection node SN and the connection node SNB is amplified, and the potential difference becomes stable in a large state. For example, in a case where the coupling weight stored in the weight storage unit 14C of the synapse circuit is the first coupling weight (MTJ element 31 has a low resistance and MTJ element 33 has a high resistance), the potential of the connection node SN becomes higher than the potential of connection node SNB, and in a case where the coupling weight is the second coupling weight (MTJ element 31 has a high resistance and MTJ element 33 has a low resistance), the potential of the connection node SNB becomes higher than the potential of the connection node SN.

In the MOS transistor 34, the drain is connected to the electrode 67b of the capacitor 67 via the MOS transistor 65 that is turned on and the output line OL, and the source is grounded via the source line SL. Then, the potential of the connection node SN is applied to the gate of the MOS transistor 34. For this reason, the MOS transistor 34 discharges the capacitor 67 with a discharge current Ipre having a magnitude corresponding to the potential of connection node SN. In addition, the discharge current Ipre does not flow in a case where the potential of the connection node SN is lower than the potential of the connection node SNB and the potential is lower than the gate threshold voltage of the MOS transistor 34.

The capacitor 67 is always charged by the power source 71, but when the capacitor is discharged by the MOS transistor 34, the charging voltage, that is, the potential of the electrode 67b is reduced. As the discharge current Ipre becomes large, the reduction in the potential of the electrode 67b becomes large.

On the other hand, the discharge current Ipre by the MOS transistor 34 becomes large as the gate voltage of the MOS transistor 34 becomes high. That is, as the potential of the connection node SN becomes high, the discharge current Ipre becomes large. As described above, the potential of the connection node SN is relatively high in the case of the first coupling weight and low in the case of the second coupling weight. Therefore, in one synapse circuit, as the coupling weight stored in the synapse circuit becomes large, the potential of the electrode 67b is greatly reduced.

Similarly, for the other synapse circuit connected to the electrode 67b, when the first pre-spike pulse is input from the input circuit of the preceding stage, the discharge current Ipre corresponding to the stored coupling weight is flowed in response to the input. As a result, the potential of the electrode 67b is reduced to a magnitude based on the sum of the discharge currents Ipre of the synapse circuits. But the magnitude of the reduction in the potential of the electrode 67b changes as the sum of the discharge currents Ipre of the synapse circuits changes. Then, when the sum of the discharge currents Ipre becomes a certain level or more and the potential of the electrode 67b falls below the threshold value of the pulse generator 43, the first post-spike pulse is output from the pulse generator 43. In addition, the other operations in the learning mode and the recognition mode are the same as those in the first embodiment.

Similarly to the first embodiment, since the rewriting time of the MTJ elements 31 and 33 is very short, the neural network circuit device of the second embodiment can operate at a high speed. In addition, since the time required for the potential difference between the connection node SN and the connection node SNB to be amplified and stabilized by the differential pair of the MOS transistors 32 and 34 is very short, a high speed operation is possible. Therefore, the neural network circuit device has a more optimal configuration.

The coupling weight stored in the synapse circuit may be a binary coupling weight that is any of a first coupling weight having a relatively large weighted level or a second coupling weight having a relatively small weighted level or may be a multi-valued coupling weight that is any of three or more coupling weights having different weighted levels.

In a case where the coupling weight stored in the synapse circuit is multi-valued, for example, each synapse circuit is provided with a plurality of memory units including a weight memory unit and a selection unit, and similarly to the above examples, each weight storage unit is configured so as to store any of the first coupling weight and the second coupling weight. The pulse widths of the second post-spike pulses input to the selection units in one synapse circuit are set to be different from each other within a time of ½ Tw (Tw is a specified time), and similarly, the pulse widths of the second pre-spike pulse are set to be different from each other within a time of ½ Tw (Tw is a specified time). For example, in a case where M is an integer of 2 or more and the first to M-th storage units are provided in the synapse circuit, each pulse width of the second pre-spike pulse and the second post-spike pulse input to the selection unit of the i-th (i is 1, 2, . . . , M) storage unit can be set to "½ Tw–(i–1) (1/(2M))Tw". Therefore, the number of weight storage units to which the selection signal is input changes in a range from 0 to M according to the length of the pulse time difference ΔT (absolute value) between the first post-spike pulse and the first pre-spike pulse.

With attention paid to one synapse circuit, in a case where the first pre-spike pulse precedes the first post-spike pulse, as the pulse time difference ΔT becomes small, the number of weight memory units in which the first coupling weight is written becomes large, and as the pulse time difference ΔT becomes large, the number of weight memory units in which the first coupling weight is written becomes small. On the contrary, in a case where the first post-spike pulse precedes the first pre-spike pulse, as the time difference ΔT becomes small, the number of weight memory units in which the second coupling weight is written becomes large, and as the pulse time difference ΔT becomes large, the number of weight memory units in which the second coupling weight is written becomes small. In a case where the pulse time difference ΔT exceeds the time "½ Tw", the number of weight memory units in which the first coupling weight or the second coupling weight is written is 0, and the coupling weight does not change (is not updated). As a result, one synapse circuit can store M+1 types of coupling weights corresponding to the state in which the first coupling weight is stored in the 0 to M weight memory units (the second coupling weight is stored in the weight memory unit that does not store the first coupling weight).

Also in this case, each weight memory unit outputs a voltage or a current corresponding to the stored coupling weight to the main body unit when the first pre-spike pulse as the input signal is output. In response to the input of the first pre-spike pulse, each voltage or each current corresponding to the coupling weight stored in each weight memory unit is output from one synapse circuit to the main body unit. Since the main body unit operates on the basis of the sum of input voltages or currents, the main body unit also operates on the basis of the sum of voltages or currents from one synapse circuit, and as a result, any of the M+1 types of coupling weights stored in the synapse circuit is output to the main body unit.

REFERENCE SIGNS LIST

10 Neural network circuit device
11 Synapse circuit
14, 14A, 14B, 14C Weight memory unit
17 Neuron circuit
18 Main body unit
21, 22 Inverter
23 to 25, 32, 34, 41, 42, 52, 53, 65 MOS transistor
31, 33, 51, 57 MTJ element
36 Capacitor
43 Pulse generator
55 Delay circuit
67 Capacitor
67a, 67b Electrode
68 MOS transistor
71 Power source
BL Bit line
BLB Bit line
CG Control gate
FG Floating gate

The invention claimed is:

1. A neural network circuit device comprising a plurality of synapse circuits storing a synaptic coupling weight and a neuron circuit connected to the plurality of synapse circuits,
wherein the plurality of synapse circuits store the synaptic coupling weight in a non-volatile manner and output a voltage signal having a magnitude based on the stored synaptic coupling weight in response to an input signal, and wherein the neuron circuit comprises:
a neuron MOS transistor having a floating gate and a plurality of control gates which are capacitively coupled to the floating gate and to which the voltage signals from the plurality of synapse circuits are input respectively; and
a pulse generator outputting a pulse signal by turning on or off the neuron MOS transistor.

2. The neural network circuit device according to claim 1, wherein the plurality of synapse circuits store a binary or multi-valued synaptic coupling weight.

3. The neural network circuit device according to claim 1, wherein the plurality of synapse circuits have a magnetic tunnel junction element which is in a magnetization state based on the synaptic coupling weight and stores the synaptic coupling weight in a non-volatile manner according to the magnetization state of the magnetic tunnel junction element.

4. The neural network circuit device according to claim 1, wherein the plurality of synapse circuits comprise:
a pair of inverters being cross-coupled and each including an inverter MOS transistor and a magnetic tunnel junction element, which are connected in series;
a writing unit allowing the magnetic tunnel junction elements to have different magnetization states by flowing a write current based on the synaptic coupling weight to be stored to flow in each magnetic tunnel junction element of the pair of inverters; and
a reading unit activating the pair of inverters in response to an input signal and outputting the voltage signal from an output terminal of one inverter.

5. The neural network circuit device according to claim 4, wherein in the plurality of synapse circuits, the output terminal of the one inverter is connected to the control gate via a capacitor.

6. The neural network circuit device according to claim 5, wherein the reading unit is a power gating MOS transistor connecting a power source line to a connection node between the magnetic tunnel junction elements at a timing of outputting the voltage signal.

7. The neural network circuit device according to claim 4, further comprising a pair of bit lines which are respectively connected to input terminals of the pair of inverters and in which positive and negative of a potential difference between the bit lines are inverted,
wherein the writing unit has a pair of transfer gates which are respectively connected between the bit lines and the respective input terminals of the pair of inverters and are turned on and off at a timing based on the synaptic coupling weight to be stored.

8. A neural network circuit device comprising a plurality of synapse circuits storing a synaptic coupling weight and a neuron circuit connected to the plurality of synapse circuits,
wherein the neuron circuit comprises:
a capacitor having one electrode grounded;
a load connected between the other electrode of the capacitor and a power source; and
a pulse generator generating a pulse signal on the basis of a potential of the other electrode, and
wherein the plurality of synapse circuits comprises:
a pair of inverters being cross-coupled and each including an inverter MOS transistor and a magnetic tunnel junction element, which are connected in series;
a writing unit allowing the magnetic tunnel junction elements to have different magnetization states by allowing a write current based on the synaptic coupling weight to be stored to flow in each magnetic tunnel junction element of the pair of inverters; and
a reading unit activating the pair of inverters in response to an input signal and flowing a current discharging the other electrode of the capacitor via the inverter MOS transistor of one inverter.

9. A neural network circuit device comprising a plurality of synapse circuits storing a synaptic coupling weight in a non-volatile manner and a neuron circuit connected to the plurality of synapse circuits,
wherein the plurality of synapse circuits include a capacitor having one end to which a voltage having a magnitude based on the stored synaptic coupling weight is input in response to an input signal, and
wherein the neuron circuit includes:
a neuron MOS transistor having a floating gate and a plurality of control gates which are capacitively coupled to the floating gate and to which the other ends of the capacitors of the plurality of synapse circuits are connected respectively and voltage signals are input; and
a pulse generator outputting a pulse signal by turning on or off the neuron MOS transistor.

10. The neural network circuit device according to claim 1,
wherein the neuron circuit outputs two types of post-spike pulses having different pulse widths as the pulse signal to the plurality of synapse circuits, and
wherein the plurality of synapse circuits generate a selection signal for storing the coupling weight on the basis of timings of two types of pre-spike pulses having different pulse widths from an input circuit of a preceding stage and the two types of the post-spike pulses.

11. The neural network circuit device according to claim 1,
wherein the neuron circuit outputs the pulse signal as a first post-spike pulse and outputs a second post-spike pulse having a pulse width larger than that of the first post-spike pulse from a time of outputting the first post-spike pulse, and
wherein the plurality of synapse circuits include:
a weight storage unit which stores a weight in response to a selection signal; and
a selection unit which outputs the selection signal when the first post-spike pulse and the second post-spike pulse are input, a first pre-spike pulse from the input circuit of the preceding stage and a second pre-spike pulse having a pulse width being larger than that of the first pre-spike pulse and being output from the time of outputting the first pre-spike pulse are input, and the first post-spike pulse and the second pre-spike pulse are input at the same time, and when the second post-spike pulse and the first pre-spike pulse are input at the same time.

* * * * *